(12) United States Patent
Chen et al.

(10) Patent No.: US 6,224,941 B1
(45) Date of Patent: May 1, 2001

(54) PULSED-VAPOR PHASE ALUMINIDE PROCESS FOR HIGH TEMPERATURE OXIDATION-RESISTANT COATING APPLICATIONS

(75) Inventors: Keng N. Chen; Kwok H. Yow, both of Singapore (SG)

(73) Assignee: General Electric Company, Cincinnati, OH (US)

(*) Notice: Subject to any disclaimer, the term of this patent is extended or adjusted under 35 U.S.C. 154(b) by 0 days.

(21) Appl. No.: 09/219,155

(22) Filed: Dec. 22, 1998

(51) Int. Cl.$^7$ .................................................. C23C 16/12
(52) U.S. Cl. .................... 427/252; 427/253; 427/295; 427/328; 427/398.1
(58) Field of Search ..................... 427/250, 252, 427/328, 253, 295, 398.1

(56) References Cited

U.S. PATENT DOCUMENTS

| | | | |
|---|---|---|---|
| 4,965,095 | 10/1990 | Baldi | 427/252 |
| 5,264,245 | * 11/1993 | Punola et al. | 427/250 |
| 5,492,726 | * 2/1996 | Rose et al. | 427/252 |
| 5,928,725 | * 7/1999 | Howard et al. | 427/250 |

* cited by examiner

Primary Examiner—Timothy Meeks
Assistant Examiner—Bret Chen
(74) Attorney, Agent, or Firm—Andrew C. Hess; Gerry S. Gressel

(57) ABSTRACT

An improved process for applying aluminide coatings to superalloy components used in gas turbine applications resulting in a more uniform coating with less hazardous waste by-products. The process involves the steps of placing the superalloy components into a retort with an aluminum-containing source, evacuating air from the retort and introducing an inert gas, heating the retort to a preselected temperature, while maintaining the preselected temperature purging the inert gas from the retort by introducing hydrogen gas, while maintaining the preselected temperature, pulsing, by reducing the retort pressure to a preselected pressure below atmospheric pressure, followed by introducing a halide-containing gas to react with the aluminum-containing source to create an aluminum-rich vapor that deposits aluminum on the components, then reintroducing hydrogen gas into the retort to purge the gases within the retort; and cooling the retort.

18 Claims, 2 Drawing Sheets

PULSED-VAPOR PHASE ALUMINIDE PROCESS FOR HIGH TEMPERATURE OXIDATION-RESISTANT COATING APPLICATIONS

BACKGROUND OF THE INVENTION

1. Field of the Invention

The present invention is directed toward a process for applying aluminide coatings to superalloy components used in gas turbine applications, and more particularly to an improved vapor phase aluminiding process to coat nickel-based and cobalt-based superalloy components used in the turbine section of gas turbine engines.

2. Discussion of Prior art

Aluminide coatings are applied to provide protection of superalloy turbine components from gas turbine engines to protect the substrate material by many different processes. One such process is set forth in U.S. Pat. No. 3,837,901, ('901) now expired, to Seybolt, incorporated herein by reference and assigned to the assignee of the present invention. In the 901' patent, an aluminide coating is applied by embedding the turbine components in a bed of powders having aluminum as a source. Generally, the active powders set forth in this patent were iron-aluminum compounds mixed with inert alumina, and the powders were activated by passing a halide gas through the carrier while heating the bed to a temperature in the range of about 1650° F. to about 2000° F. Subsequent improvements in the process have included modifications in the aluminum powder sources, modifications in the powder sizes and improvements in the gas delivery systems. These processes have generally come to be known as "pack processes" or vapor phase aluminide processes. These processes have several infirmities. First, since they involve producing coatings requiring specific compositions, they must be carefully mixed so that the coating compositions can be attained. However, once depleted, the mixed metal powders are not readily recyclable, cannot be replenished and present a disposal problem. A second problem associated with these pack processes is that the measuring and moving as well as disposing of the powders is labor intensive. Third, the process, while producing a good protective coating, yields a coating of varying thickness that is not easily controlled. Finally, as temperature demands of gas turbines have increased, cooling passages have been added to the turbine components. The powders of the pack processes frequently clog these channels, and the removal of these powders from these fine cooling passages is a further problem.

What is desired is a coating method that produces a good quality aluminide coating while avoiding the problems associated with the prior art pack processes.

BRIEF SUMMARY OF THE INVENTION

The present invention provides an improved process for applying aluminide coatings to superalloy components used in gas turbine applications. As compared with the prior available vapor phase aluminiding techniques for applying these aluminide coatings, the processes of the present invention provides an aluminide coating that has a more even coating thickness, while maintaining the advantage of the relatively thin coatings typically associated with vapor phase aluminiding processes.

A further advantage of the present invention is that the process is less labor intensive and more environmentally friendly, since heavy powders are not involved, eliminating the need to move these powders or to dispose of these powders. The pellets used in the present invention are easier to segregate and reprocess, if needed.

In accordance with the present invention, an improved process for applying aluminide coatings to superalloy components used in gas turbine applications comprises a series of steps, the first of which is to place the superalloy components into a retort with an aluminum-containing source. Air is then evacuated from the retort by introducing an inert gas into the retort. The retort is then heated, typically by placing the retort into a furnace, to a preselected temperature. While maintaining the preselected temperature, the inert gas is purged from the retort by introducing hydrogen gas. The hydrogen gas in the retort is then reduced to a preselected pressure below atmospheric pressure, by imposing a partial vacuum, while the temperature is held constant. Next, a halide-containing gas is introduced into the retort. This gas reacts with the aluminum source in the retort at the preselected temperature, creating a vapor of aluminum rich gas. The vapor of aluminum-rich gas passes over the surface of the superalloy substrate interacting with it to deposit a thin, substantially uniform coating until a thin coating is obtained. Hydrogen gas is then reintroduced into the retort to purge the gases from the retort. The process of introducing and purging the halide-containing gas into the retort can be repeated to uniformly increase the thickness of the coating as desired. After the desired thickness is achieved, the pressure of the gases in the retort are again reduced below atmospheric pressure, insert gases are introduced into the retort and the retort is cooled.

Thus, it can be seen that an advantage of the present invention is that a uniform, yet thicker aluminide coating can be achieved with the process of the present invention, if so desired.

Another advantage of the present invention is that since powders are not required to be used as an aluminum source or as filler material, the tendency for cooling holes to become plugged with powders in typical turbine components such as airfoils is eliminated. Finally since powders are not required, the labor intensive powder preparation process involving the accurate weighing and mixing of powders can be eliminated.

Other features and advantages of the present invention will be apparent from the following more detailed description of the preferred embodiment, taken in conjunction with the accompanying drawings which illustrate, by way of example, the principles of the invention.

DETAILED DESCRIPTION OF THE INVENTION

Figure 1:
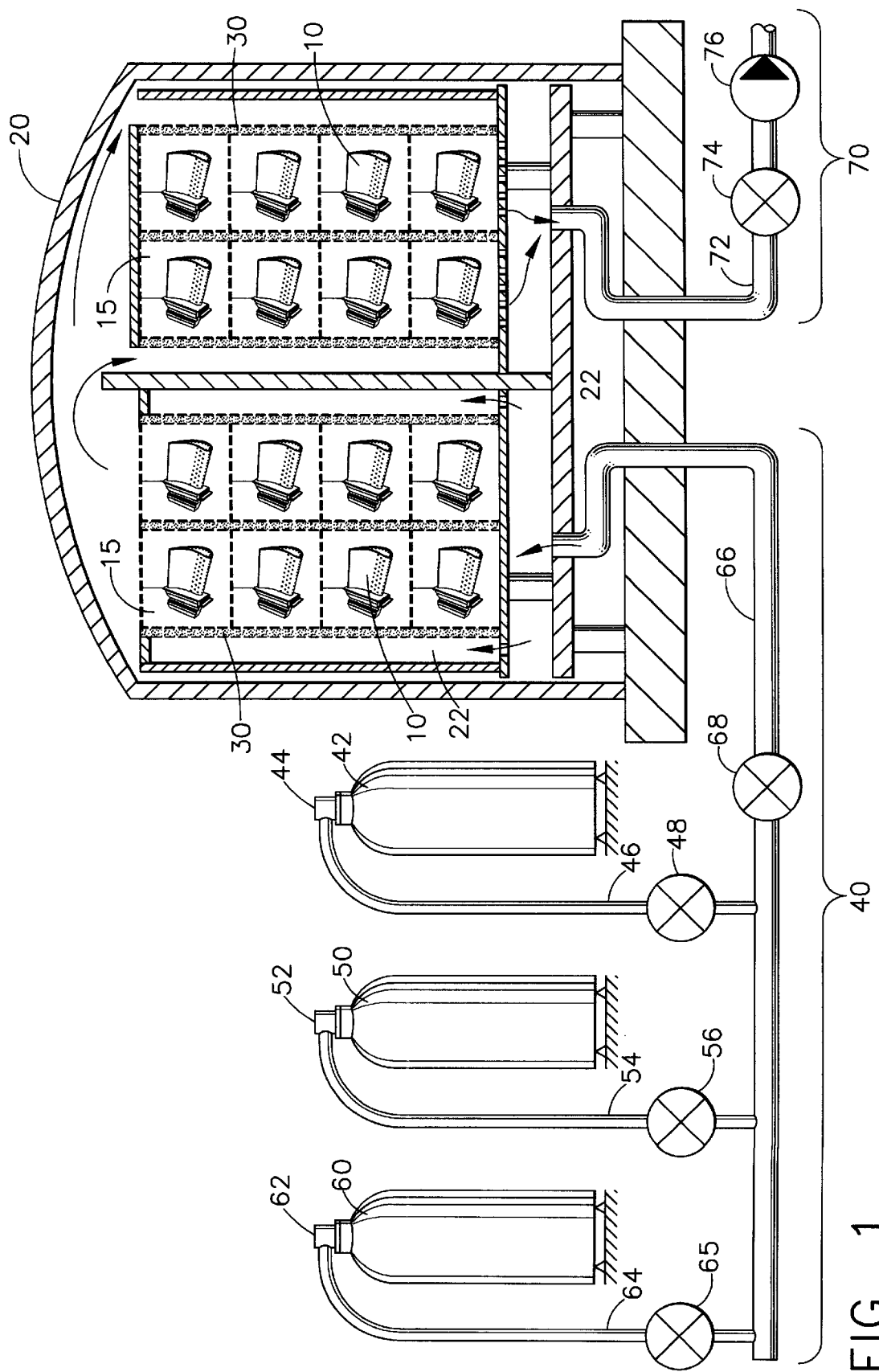
FIG. 1 is a schematic of the apparatus used to practice the process of the present invention.
Figure 2:
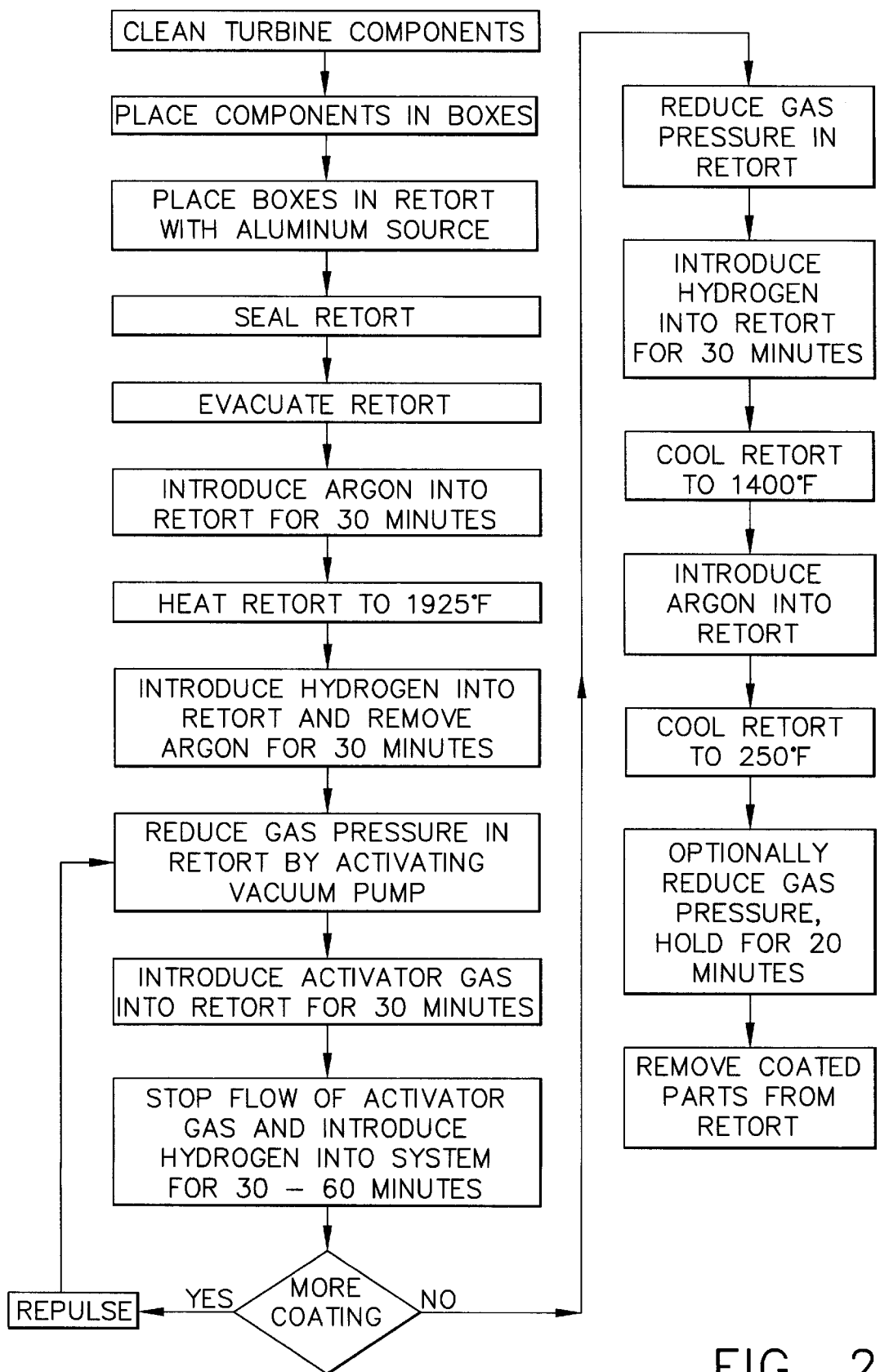
FIG. 2 is a flow chart of the process used to produce the coating of the present invention.

FIG. 1 represents a schematic of one embodiment of the apparatus used to practice the process of the present invention. The process of the present invention can thoroughly be understood by reference to this schematic drawing and FIG. 2 which is a flow chart of the process used to produce the coating of the present invention. Whenever possible, the same reference numbers will be used throughout the figures to refer to the same parts.

In accordance with the present invention, turbine components, typically airfoils 10, are placed into a retort after cleaning. These components are typically made from nickel-based and cobalt-based superalloy compositions. If the airfoils 10 are newly manufactured, they are typically cleaned by degreasing. However, the present invention may also be utilized to recoat turbine components removed from service. Such components first must be stripped of any prior coatings by well-known stripping processes, typically by grit-blasting with fine alumina powder, although acid-stripping followed by fluoride ion cleaning is also utilized.

A retort 20 is filled with an aluminum-containing source, which acts as a media. This media in a preferred embodiment is shown as coarse pellets 30, which are preferred if the airfoils 10 are to be "packed" within the media. The coarse pellets act to prevent the fine air passages from being clogged, which is a common problem when fine powders are used as the media. In the best mode of practicing the present invention, the airfoils were placed in a plurality of coating boxes 15. Boxes 15 were placed in a retort 20 which was then placed in a furnace (not shown). In the best mode, pellets 30 were placed in proximity to the airfoils 10, but not in physical contact with airfoils 10. The best mode of practicing the present invention is shown in FIG. 1. The arrangement of pellets and airfoils can be accomplished in any one of a number of ways, such as by incorporating a chamber within coating box 15 to hold the pellets 30, such as the vertical chambers shown in FIG. 1. However, airfoils 10 may be suspended over a bed of pellets 30 in each box 15, or may be supported on platforms in each box 15 which elevate airfoils 10 over pellets 30. In a preferred embodiment, the size of the pellets varies from about 4 mm (0.15 in.) to about 16 mm (0.63 in.). In another variation, airfoils 10 may be suspended over the media within the retort 20, and media need not be coarse pellets. Typically, components undergoing a coating process will not simultaneously be suspended above the-pack and packed in the media, as it would be difficult to control the thickness of the applied coating to both packed and suspended airfoils 10. In the preferred embodiment, airfoils 10 are placed in coating boxes out of contact with the media and reference will be made to such airfoils 10, it being understood that all other aspects of the invention can be accomplished using airfoils packed in pellets or airfoils 10 suspended over media in retort 20.

After airfoils 10 are placed within retort 20 with the aluminum-containing media, which in a preferred embodiment are cobalt-aluminum pellets, retort 20 is then sealed and placed into a furnace, not shown in FIG. 1. An internal gas distribution system 22 is included in the system. It will be understood by those skilled in the art that any source of heating retort 20 may be used, such as convective or inductive heat sources, and that the temperature within retort 20 is controlled by thermocouples. The gas distribution system 22 is connected to an inlet gas system 40 and an outlet gas system 70, and the retort is sealed.

Inlet gas system 40 includes a supply of hydrogen fluoride activator gas 42, a supply of inert carrier 50, and a supply of hydrogen gas 60. Associated with each volume of gas is a pressure regulator or mass flow regulator 44, 52, 62 respectively. A pressure regulator or mass flow regulator may be used interchangeably, since in a given system, if pressure flow is known, the mass flow can be calculated and vice versa. A supply line 46, 54, 64 connects the respective gas supplied to valves 48, 56, 65 that are in turn connected to inlet gas line 66, which is connected to an inlet valve 68. Each of the valves is operated by a controller (not shown) that opens or closes the valves so that the required gas may flow as set by gas regulators 44, 52, and 62 from the gas supplies to the inlet line 66 and into gas distribution system in the retort.

Outlet gas system 70 is comprised of an outlet line 72, an outlet valve 74 and an outlet vacuum pump 76. Both outlet valve 74 and outlet vacuum pump 76 are operated by the controller (not shown) that maintains control over the inlet 40 and outlet 70 gas systems so that the process of the present invention can be accomplished.

After the sealed retort 20 is positioned within the furnace, air is evacuated by drawing a partial vacuum from the retort by activating outlet gas system 70 by opening valve 74 and activating vacuum pump 76. After air has been evacuated, pump 76 is deactivated and inert gas, preferably argon, from supply 50 flows through valves 56, 68 into the retort while valves 48 and 65 remain closed. The argon purges the system for a first preselected time at a first preselected flow rate, in the best mode for at least about 30 minutes at a flow rate of 200–300 SCFH. Times and flow rates are not critical and different times and flow rates may be utilized so long as air is successfully purged.

Following the purging of the air, the retort is heated to a first preselected temperature in the furnace while maintaining an inert gas atmosphere. In the best mode, the gas flow was reduced to 100–200 SCFH, while heating to a temperature in the range of 1700° F. to about 2200° F. and preferably in the range of 1925±25° F.

Upon reaching the first preselected temperature, the flow of inert gas is stopped and gas from hydrogen supply 60 is introduced into the system at a third preselected flow rate for a second preselected time in order to purge inert gas from the system. This is accomplished by closing valve 56 and opening valve 65. In the best mode, hydrogen flowed at a rate of 200–300 SCFH for at least 30 minutes, while the first preselected temperature, was maintained. Times and flow rates are not critical and different times and flow rates may be utilized so long as the inert gas is successfully purged.

The system is now pulsed. While maintaining the first preselected temperature, about 1925° F. in a preferred embodiment, the pressure within retort 20 is reduced to a first preselected reduced pressure by evacuating hydrogen gas. This pressure should be at least about 680 Torr and preferably below 600 Torr. In the best mode, this pressure was about 550 Torr. However, lower pressures are acceptable, and are even preferable if achievable. The evacuation is accomplished by closing gas valves 64 as well as 56, if open, and activating pump 76. Preferably, valve 68 is also closed. This reduced pressure is held for a third preselected time, preferably about one minute.

While maintaining the first preselected temperature, halide-containing activator gas is then introduced into the retort, which is below atmospheric pressure. In the best mode, the halide-containing gas was hydrogen fluoride, HF. Further, the HF is introduced into the retort with a carrier gas at a fourth preselected flow rate for a fourth preselected time. Although the carrier gas may be an inert gas, in the best mode, it was hydrogen, and the ratio of hydrogen gas to activator gas was in the range of (3–10):1 and most preferably in the range of 7:1. This is accomplished by providing an activator gas flow of about 50 SCFH and a hydrogen gas flow of about 350 SCFH. Valves 48 and 65 are opened and the carrier gas and activator gas are mixed. In the best mode, the gas pressure was allowed to build to about 50–60 psi, and the gases flowed through gas distribution system 22, and up around pellets 30. As the gases flowed over and through the aluminum-containing pellets, the HF reacted with the pellets, and an aluminum-containing gas was formed, which then deposited a coating uniformly over the airfoils as the gas passed over and through the airfoils. This flow continued for about 30 minutes in the best mode, but longer or shorter times are permissible. A coating thickness in the range of about 0.001–0.005 inches is preferred, and in the best mode, a coating thickness in the range of 0.002–0.004 inches was typically achieved after 3 to 4 cycles or pulses. Closing valve 48 now stops the flow of halide-containing gases. The system now is purged by supplying hydrogen gas at a fifth preselected flow rate, preferably at about 40–60 SCFH, for a fifth preselected time. This can be accomplished by closing either or both of valves 65 and 68, thereby stopping the flow of hydrogen, readjusting regulator 62 and reopening valves 65, 68, or simply by reducing the flow of hydrogen by using regulator 62. Although any time and pressure sufficient to purge the halide containing gas from the system is acceptable, in the best mode, the flow was maintained for about 30–60 minutes.

If a thicker coating is desired, the pulsing process is repeated by stopping the flow of the halide-containing gases, reducing the retort pressure to below atmospheric pressure, reintroducing the halide containing gas, followed by purging the system with hydrogen. When the desired coating thickness is achieved, the pulsing process can be stopped. As noted above, in the best mode of practicing the present invention, a coating thickness of 0.002–0.004 inches was achieved in 3–4 cycles or "pulses".

After pulsing is completed, the retort pressure is again reduced to a second preselected pressure below atmospheric pressure for a sixth preselected time. This is accomplished by closing inlet valve 68 and activating pump 76. The pressure should be reduced to at least 680 Torr, preferably 600 Torr and lower pressures are preferable. In the best mode of practicing the present invention, a pressure of 550 Torr was achieved. This pressure was held for about one minute.

Hydrogen gas is then reintroduced into the system at a sixth preselected flow rate for a seventh preselected time. As before, the flow rate and time are not critical, so long as they are sufficient to purge the system of any remaining halide gases. In the best mode, a flow rate of about 400 SCFH was established by adjusting regulator 62 and opening valves 65, 68 for about 30 minutes.

The retort was then allowed to cool to a second preselected temperature, in the preferred embodiment, about 1400° F. At this point, inert gas, argon, was reintroduced into the retort at a seventh preselected flow rate by closing valve 65 and opening valve 56. With argon purging the system, the retort was cooled to a third preselected temperature, about 250° F. In the best mode, upon reaching 250° F. the system was pumped down below 680 Torr, preferably to below 600 Torr for about 20–30 minutes and most preferably to 50 Torr for 20 minutes to remove any residual gases. The retort was then backfilled with argon. The coated parts were then removed from retort 20. The step of removing residual gases in the best mode at 250° F. is optional.

The airfoils coated by the process of the present invention have a more uniform coating thickness, as the pulsing effect of the gases into the retort resulted in a more uniform distribution of gases around the part. Each cycle of pulsing takes an hour to an hour and a half. Furthermore, the cobalt/aluminum pellets may be reused, to coat additional parts. If a pack is used, to prevent clogging of cooling holes, the fines may be sifted by passing the pellet media through mesh screens. The fines may then be reprocessed.

Although the present invention has been described in connection with specific examples and embodiments, those skilled in the art will recognize that the present invention is capable of the variations and modifications within its scope. These examples and embodiments are intended as typical of, rather than in any way limiting on, the scope of the present invention as presented in the appended claims.

What is claimed is:

1. A process for applying aluminide coatings to superalloy components used in gas turbine applications, comprising the steps of:

cleaning the superalloy components;

placing an aluminum-containing source into a retort;

placing the superalloy components in proximity to the aluminum-containing source in the retort; then sealing the retort;

evacuating air from the retort by reducing gas pressure below at least about 680 Torr, followed by purging the retort with inert gas at a first preselected flow rate for a first preselected time;

heating the retort to a temperature in the range of about 1700° F.–2200° F. while providing inert gas at a second preselected flow rate;

upon reaching the temperature in the range of about 1700° F.–2200° F., stopping the flow of inert gas and introducing hydrogen gas at a third preselected flow rate for a second preselected time to purge the inert gas from the retort; then while maintaining the temperature of the retort at a substantially uniform temperature in the range of about 1700° F.–2200° F., pulsing by reducing the hydrogen gas pressure in the retort to a pressure below 600 Torr and holding the pressure for a third preselected time, then introducing a combination of hydrogen gas and a halide-containing gas in the ratios of about three to ten parts hydrogen to one part halide-containing gas ((3–10):1) at a fourth preselected flow rate into the retort for a fourth preselected time to cause the halide-containing gas to react with the aluminum containing source creating an aluminum-containing vapor that uniformly flows over the superalloy components causing deposition of a coating onto the surfaces of the superalloy components, followed by stopping the flow of the halide-containing gas and introducing hydrogen gas into the retort at a fifth preselected flow rate for a fifth preselected time;

repeating the step of pulsing by reducing the retort pressure, flowing the combination of hydrogen gas and halide-containing gas and stopping the flow of the gas until a predetermined coating thickness is achieved on the superalloy components; then reducing the retort pressure to a pressure in the range of 500–600 Torr and holding for at least about one minute; then introducing hydrogen at a sixth preselected flow rate for a sixth preselected time; then cooling the retort to a temperature of about 1400° F.;

introducing a flow of inert gas into the retort;

cooling the retort to about 250° F., followed by reducing the pressure of inert gas in the retort to below at least about 680 Torr for about at least 20 minutes; and cooling the retort to room temperature and removing the superalloy components.

2. The process of claim 1 wherein the superalloy components include airfoils.

3. The process of claim 1 wherein the aluminum-containing source includes cobalt-aluminum pellets having a size of from about 4 mm to about 16 mm.

4. The process of claim 1 wherein the inert gas is argon.

5. The process of claim 1 wherein the first preselected time is about 30 minutes.

6. The process of claim 1 wherein the steps of heating the retort while providing inert gas, stopping the flow of inert gas and maintaining the temperature includes heating the retort, stopping the flow of inert gas and maintaining the temperature in a range of about 1925°±25° F.

7. The process of claim 1 wherein the step of repeating the step of pulsing to achieve a predetermined coating thickness includes achieving a coating thickness in the range of about 0.001–0.004 inches.

8. The process of claim 1 wherein the first preselected flow rate is about 200–300 SCFH for the first preselected time of about 30 minutes.

9. The process of claim 1 wherein the second preselected flow rate is 100–300 SCFH.

10. The process of claim 9 wherein the second preselected flow rate is 200–300 SCFH.

11. The process of claim 1 wherein the third preselected flow rate is 200–300 SCFH and the second preselected time is about 30 minutes.

12. The process of claim 1 wherein the third preselected time is about one minute.

13. The process of claim 1 wherein the fourth preselected flow rate is about 400 SCFH and the fourth preselected time is about 30 minutes.

14. The process of claim 1 wherein the halide containing gas is hydrogen fluoride.

15. The process of claim 1 wherein the fifth preselected flow rate is 40–60 SCFH and the fifth preselected time is about 30–60 minutes.

16. The process of claim 1 wherein the sixth preselected flow rate is about 400 SCFH and the sixth preselected time is about 30 minutes.

17. The process of claim 1 wherein the step of pulsing by reducing hydrogen gas pressure in the retort includes reducing hydrogen gas pressure to about 550–600 Torr.

18. The process of claim 1 wherein the step of pulsing by reducing hydrogen gas pressure in the retort includes introducing hydrogen and hydrogen fluoride in the ratio of seven parts hydrogen to one part hydrogen fluoride (7:1).

* * * * *